Figure 1:
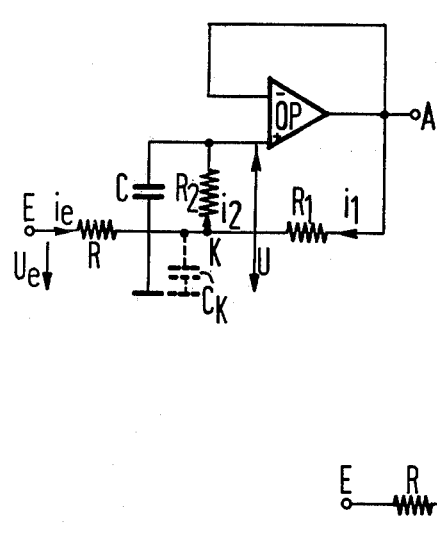

United States Patent [19]

Kriedt et al.

[11] 4,335,359
[45] Jun. 15, 1982

[54] MONOLITHICALLY INTEGRABLE LOWPASS FILTER CIRCUIT

[75] Inventors: Hans Kriedt; Andreas Dietze, both of Munich, Fed. Rep. of Germany

[73] Assignee: Siemens Aktiengesellschaft, Berlin and Munich, Fed. Rep. of Germany

[21] Appl. No.: 115,257

[22] Filed: Jan. 25, 1980

[30] Foreign Application Priority Data

Jan. 29, 1979 [DE] Fed. Rep. of Germany ....... 2903299

[51] Int. Cl.³ .............................................. H03F 1/34
[52] U.S. Cl. .................................... 330/257; 330/107; 330/260; 330/294; 330/306
[58] Field of Search ................ 330/107, 257, 260, 302, 330/303, 306, 307, 294, 109

[56] References Cited

U.S. PATENT DOCUMENTS 3,831,117  8/1974  Fletcher et al. ................... 330/302
3,969,682  7/1976  Rossum ............................ 330/306 X
4,223,276  9/1980  Nagano ............................ 330/257

Primary Examiner—James B. Mullins
Attorney, Agent, or Firm—Herbert L. Lerner; Laurence A. Greenberg

[57] ABSTRACT

Monolithically integrable lowpass filter circuit having at least one capacitor and one ohmic resistor includes a signal input, a circuit node connected to the signal input, a first series resistor connected between the signal input and circuit node, an operational amplifier, a signal output connected to the output of the operational amplifier and to the circuit node, a second resistor connected between the circuit node and the signal output, a third resistor connected between the circuit node and the non-inverting input of the operational amplifier, and a capacitor connected between the non-inverting input and ground, the signal output being further connected to the inverting input of the operational amplifier.

7 Claims, 2 Drawing Figures

MONOLITHICALLY INTEGRABLE LOWPASS FILTER CIRCUIT

The invention relates to a monolithically integrable lowpass filter circuit comprising at least one capacitor and one ohmic resistor.

As is well known, such circuits are constructed as R-C combinations; according to experience, the circuit arrangements for R-C sections available in semiconductor technology lead to high cutoff frequencies. In order to obtain lower cutoff frequencies, external components must be resorted to in the known arrangements of this type.

It is accordingly an object of the invention to provide a wholly monolithically integrable lowpass filter circuit which overcomes the hereinaforementioned disadvantages of the heretofore known devices of this general type, which can be monolithically integrated to the full extent, which makes it possible to obtain in a problem-free manner, cutoff frequencies in the low-frequency range, and which therefore permits wide application of the filter circuit in the low-frequency region, be it in an application of AM techniques or be it in an application of FM techniques.

With the foregoing and other objects in view, there is provided, in accordance with the invention, a monolithically integrable lowpass filter circuit having at least one capacitor and one ohmic resistor, comprising a signal input, a circuit node connected to the signal input, a first series resistor connected between the signal input and circuit node, an operational amplifier, a signal output connected to the output of the operational amplifier and to the circuit node, a second resistor connected between the circuit node and the signal output, a third resistor connected between the circuit node and the non-inverting input of the operational amplifier, and a capacitor connected between the non-inverting input and ground, the signal output being further connected to the inverting input of the operational amplifier.

In accordance with another feature of the invention, the circuit components are semiconductor components.

In accordance with a further feature of the invention, there is provided a current-mirror transistor having two collectors and a first, second, third, fourth and fifth transistor, each having its emitter, base and collector zones doped oppositely to the current-mirror transistor, the non-inverting input of the operational amplifier being the base of the first transistor, the emitter of the first transistor being connected to the emitter of the second transistor, the collector of the first transistor being connected to the base and one collector of the current-mirror transistor, the collector of the second transistor being connected to the other collector of the current-mirror transistor and to the base of the fifth transistor, the emitter of the current-mirror transistor and the collector of the fifth transistor being connected to a common stabilizing potential relative to ground, the emitter of the fifth transistor being connected to the base of the second transistor, to the collector of the fourth transistor and to the signal output, the emitters of the first and second transistors being connected to the collector of the third transistor, the bases of the third and fourth transistors being connected together to a further operating potential, and the emitters of the third and fourth transistors being connected to ground.

In accordance with an added feature of the invention, there are provided series resistors connected between the emitters of the third and fourth transistors and ground.

In accordance with an additional feature of the invention, the current-reflecting transistor is of the p-n-p type and the first through fifth transistors are of the n-p-n type.

In accordance with yet another feature of the invention, the capacitor is monolithically integrable.

In accordance with yet a further feature of the invention, the capacitor is a barrier layer capacitor.

In accordance with a concomitant feature of the invention, the capacitor is an MOS capacitor.

Other features which are considered as characteristic for the invention are set forth in the appended claims.

Although the invention is illustrated and described herein as embodied in monolithically integrable lowpass filter circuit, it is nevertheless not intended to be limited to the details shown, since various modifications and structural changes may be made therein without departing from the spirit of the invention and within the scope and range of equivalents of the claims.

Figure 2:
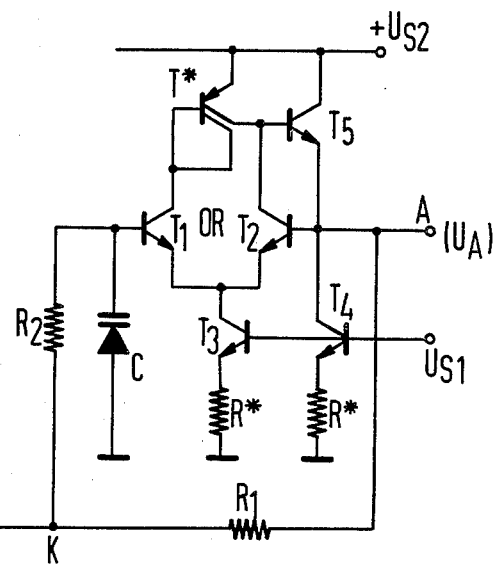

The construction and method of operation of the invention, however, together with additional objects and advantages thereof will be best understood from the following description of specific embodiments when read in connection with the accompanying drawings, in which:

FIG. 1 is a schematic circuit diagram of the lowpass filter circuit of the invention; and FIG. 2 is a diagram similar to FIG. 1, including an advantageous possibility of realization with complete details of the circuit.

Referring now to the figures of the drawing and first, particularly, to FIG. 1 thereof, it is seen that the signal input E of the filter circuit is brought through series resistor R to a circuit node K. This circuit node K is connected, on the one hand, through a further resistor $R_1$ to the output of an operational amplifier OP which is also the signal output A of the filter circuit. On the other hand, the circuit node K is connected through a third resistor $R_2$ to the non-inverting input of the operational amplifier OP. The non-inverting input of the operational amplifier OP is further connected through a capacitor C to the common reference potential (ground), and the inverting input of the operational amplifier OP is connected to the signal output A thereof.

The lowpass filter circuit just described and depicted in FIG. 1, using the reference symbols given, contains components which, as is well known, can be fully monolithically integrated. An advantageous realization of the circuit is shown in FIG. 2, which will now be discussed more fully before the operation of the invention is explained.

As is customary, the capacitor C in FIG. 2, is in the form of a monolithically integrable capacity, such as a barrier layer or MOS capacity, for example. The non-inverting input of the operational amplifier OP is represented by the base terminal of a first npn-transistor $T_1$. The emitter of the first npn-transistor $T_1$ is connected, together with the emitter of a second npn-transistor $T_2$, to a current source, in this case to the collector of a third npn-transistor $T_3$. Accordingly, the emitter of the third npn transistor $T_3$ is connected to ground through a series resistor R*. Meanwhile, the base of the third transistor $T_3$, together with the base of a fourth npn transistor $T_4$ is acted upon relative to ground (reference potential) by a first stabilizing voltage $U_{sl}$. The emitter of the fourth transistor $T_4$ is likewise tied to ground through a series resistor $R^*$. The current sources, here comprising $T_3$, $R^*$ and $T_4$, $R^*$, can be replaced by any other kind of current source.

The collector of the first npn-transistor $T_1$ is connected to the base and to the first collector of a pnp-transistor $T^*$. The emitter of the transistor $T^*$ is acted upon relative to ground by a second (positive) reference voltage $U_{s2}$. The second collector of the pnp-transistor $T^*$ is furthermore connected to the base of a fifth npn-transistor $T_5$. The collector of the transistor $T_5$ is biased relative to ground by the hereinaforementioned second stabilizing potential $U_{s2}$ and the emitter thereof is connected to the base of the second npn-transistor $T_2$.

The second collector of the pnp-transistor $T^*$ is further tied to the collector of the second npn-transistor $T_2$. Thus, the transistors $T_1$, $T^*$ and $T_2$ form a current mirror circuit. The output A of the circuit and thereby, of the operational amplifier OP, is represented by the base of the second npn-transistor $T_2$. The base of the transistor $T_2$ is connected, on the one hand, to the collector of the hereinaforementioned fourth npn-transistor $T_4$ and is connected, on the other hand, according to the definition of the invention given heretofore, through the resistor $R_1$ to the circuit node K as well as through the interaction of the second npn-transistor $T_2$ with the pnp-transistor $T^*$ and the fifth npn-transistor $T_5$, to the inverting input of the operational amplifier OP. Otherwise, the connection of the signal input E to the circuit node K through the series resistor R and the connection of this node K to the non-inverting input of the operational amplifier OP by way of the resistor $R_2$ as well as the connection of the non-inverting input of the operational amplifier OP through the capacitor C to the reference potential, correspond completely to the definition of the invention and the more general circuit shown in FIG. 1. The output signal is taken off between the output A of the operational amplifier OP and ground. If the current flowing by way of the input E of the circuit is designated with $i_e$, the corresponding input voltage with $u_e$, the current through the resistor $R_2$ with $i_2$ and the current through the resistor $R_1$ with $i_1$, and the voltage at the output A with $u_A$, then the following is obtained on the basis of Kirchhoff's law;

$$i_e = i_2 - i_1.$$

If further, $u_C$ is the voltage at the capacitor C, and $u_K$ is the voltage between the node K and ground, then it follows, because of the property peculiar to operational amplifiers, that the voltages at the inverting and at the non-inverting input are equal;

$$u_A = u_C,$$

and therefore $$i_1 = (u_C - u_K)/R_1 \text{ and } i_2 = (u_K - u_C)/R_2.$$

Thereby, the current flowing by way of the input E becomes:

$$i_e = [(u_K - u_C)/R_2] - [(u_C - u_K)/R_1],$$

and therefore, $$i_e = u_K(R_1^{-1} + R_2^{-1}) - u_C(R_1^{-1} + R_2^{-1}).$$

For the voltage $u_C$ at the capacitor C it then follows that:

$$u_C = i_2/(s \cdot C) = (u_K - u_C)/(s \cdot R_2 \cdot C),$$

with $$s = \sigma + 2\pi \cdot f \cdot \sqrt{-1},$$

where f = frequency and $\sigma \to 0$. This leads further to:

$$u_C = u_K/(s \cdot R_2 \cdot C + 1) \quad (1)$$

and for the virtual capacity of $C_K$ of the node K to ground which is calculated from the ratio $i_e/u_e$ according to $$s \cdot C_K = i_e/u_K,$$

the relation:

$$s \cdot C_K = [s \cdot C \cdot (1 + R_2/R_1)]/[(1 + s \cdot R_2 \cdot C)]. \quad (2)$$

Thus there is obtained for the transfer function A(s) of the filter circuit, because of:

$$u_C = u_K \cdot [1 + \{s \cdot (1 + R_2/R_1) \cdot C \cdot R\}/\{1 + s \cdot C \cdot R_2\}]$$

the relation $$A(s) = \frac{u_a}{u_C} = [1 + s \cdot C \cdot \{(1 + R_2/R_1) \cdot R + R_2\}]^{-1}. \quad (3)$$

For low frequencies, the term $s \cdot C \cdot R_2$ can be ignored and there is obtained:

$$C_K = C \cdot \left(1 + \frac{R_2}{R_1}\right). \quad (4)$$

The cutoff frequency is defined as that frequency at which the signal amplitude, having passed through the filter, has dropped to 6 dB. It is calculated for the present case as:

$$f_o = \left[2\pi \cdot C \cdot \left(\left(1 + \frac{R_2}{R_1}\right) \cdot R + R_2\right)\right]^{-1}. \quad (5)$$

Above $f_o$ the frequency response is approximately $-6$ dB/octave.

The hereinaforedescribed circuit therefore permits, as is easily seen on the basis of the calculation shown, that the value of an integrated capacity C transformed to the value $C_K$ is available with the multiplied value as a lowpass capacitor.

This behavior is made possible by the capacity transformation brought about by an operational amplifier OP in the circuit described.

It can further be pointed out that circuits other than the one described are also permissible for the operational amplifier OP. Similarly, the circuit shown in FIG. 1 can also be modified, on the one hand, by reversing the polarity of the bipolar transistors shown therein i.e. by using pnp-transistors for the transistors $T_1$ to $T_3$, and npn-transistor for the transistor $T^*$. This requires merely a change in the sign of the operating voltages $U_{s1}$ and $U_{s2}$. A realization in single as well as in complementary MOS technology is also possible.

We claim:

1. Monolithically integrable lowpass filter circuit comprising a signal input, a circuit node, a first series resistor connected between said signal input and circuit node, an operational amplifier, a signal output connected to the output of said operational amplifier, a second resistor connected between said circuit node and said signal output, a third resistor connected between said circuit node and the non-inverting input of said operational amplifier, and a capacitor directly connected between the non-inverting input and ground, said signal output being further directly connected to the inverting input of said operational amplifier, the circuit components being bipolar semiconductor components.

2. Circuit according to claim 1, including a current-reflecting transistor having two collectors, and a first, second, third, fourth and fifth transistor each having its emitter, base and collector zones doped oppositely to said current-reflecting transistor, said non-inverting input of said operational amplifier being the base of said first transistor, the emitter of said first transistor being connected to the emitter of said second transistor, the collector of said first transistor being connected to the base and one collector of said current-reflecting transistor, the collector of said second transistor being connected to the other collector of said current-reflecting transistor and to the base of said fifth transistor, the emitter of said current-reflecting transistor and the collector of said fifth transistor being connected to a common stabilizing potential relative to ground, the emitter of the fifth transistor being connected to the base of said second transistor, to the collector of said fourth transistor and to said signal output, the emitters of said first and second transistors being connected to the collector of said third transistor, the bases of said third and fourth transistors being connected together to a further operating potential, and the emitters of said third and fourth transistors being connected to ground.

3. Circuit according to claim 2 including series resistors connected between the emitters of said third and fourth transistors and ground.

4. Circuit according to claim 2 or 3, wherein said current-reflecting transistor is of the pnp type and said first through fifth transistors are of the npn type.

5. Circuit according to claim 1 wherein the capacitor is monolithically integrable.

6. Circuit according to claim 5 wherein the capacitor is a barrier layer capacitor.

7. Circuit according to claim 5 wherein the capacitor is an MOS capacitor.

* * * * *